US009679845B2

(12) United States Patent
Chen et al.

(10) Patent No.: US 9,679,845 B2
(45) Date of Patent: Jun. 13, 2017

(54) NECKED INTERCONNECT FUSE STRUCTURE FOR INTEGRATED CIRCUITS

(71) Applicant: Intel Corporation, Santa Clara, CA (US)

(72) Inventors: Zhanping Chen, Hillsboro, OR (US);
Andrew W. Yeoh, Portland, OR (US);
Seongtae Jeong, Portland, OR (US);
Uddalak Bhattacharya, Beaverton, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/124,867

(22) PCT Filed: May 8, 2014

(86) PCT No.: PCT/US2014/037266
§ 371 (c)(1),
(2) Date: Sep. 9, 2016

(87) PCT Pub. No.: WO2015/171147
PCT Pub. Date: Nov. 12, 2015

(65) Prior Publication Data
US 2017/0018499 A1    Jan. 19, 2017

(51) Int. Cl.
*H01L 23/525* (2006.01)
*H01L 23/528* (2006.01)
*H01L 21/768* (2006.01)

(52) U.S. Cl.
CPC .... *H01L 23/5256* (2013.01); *H01L 21/76816* (2013.01); *H01L 21/76877* (2013.01);
(Continued)

(58) Field of Classification Search
CPC ............. H01L 23/5356; H01L 23/5283; H01L 23/528; H01L 23/262; H01L 21/76816; H01L 21/76877
See application file for complete search history.

(56) References Cited

U.S. PATENT DOCUMENTS 6,172,896 B1 *  1/2001  Lee .................... G11C 17/16
                                                257/209
7,651,893 B2 *  1/2010  Chen ................... H01L 23/5256
                                                257/529

(Continued)

FOREIGN PATENT DOCUMENTS

CN        1992255       8/2010
KR    1020090090161    8/2009
(Continued)

OTHER PUBLICATIONS

International Search Report, mailed Jan. 27, 2015, for PCT Patent Application No. PCT/US2014/037266.
(Continued)

*Primary Examiner* — John C Ingham
*Assistant Examiner* — Gustavo Ramallo
(74) *Attorney, Agent, or Firm* — Green, Howard & Mughal, LLP

(57) ABSTRACT

Interconnect fuse structures including a fuse with a necked line segment, as well as methods of fabricating such structures. A current driven by an applied fuse programming voltage may open necked fuse segments to affect operation of an IC. In embodiments, the fuse structure includes a pair of neighboring interconnect lines equidistant from a center interconnect line. In further embodiments, the center interconnect line, and at least one of the neighboring interconnect lines, include line segments of lateral widths that differ by a same, and complementary amount. In further embodiments, the center interconnect line is interconnected at opposite
(Continued)

ends of a necked line segment. In further embodiments, the necked line segment is fabricated with pitch-reducing spacer-based patterning process.

20 Claims, 11 Drawing Sheets

(52) U.S. Cl.
CPC ........ *H01L 23/5283* (2013.01); *H01L 23/528* (2013.01); *H01L 2924/0002* (2013.01)

(56) References Cited

U.S. PATENT DOCUMENTS

| | | | |
|---|---|---|---|
| 2001/0042887 A1* | 11/2001 | Lee | H01L 27/0255 257/355 |
| 2004/0004268 A1* | 1/2004 | Brown | H01L 23/5252 257/529 |
| 2007/0001219 A1 | 1/2007 | Radosavljevic et al. | |
| 2008/0050903 A1 | 2/2008 | Booth, Jr. et al. | |
| 2008/0277756 A1 | 11/2008 | Min et al. | |
| 2008/0296728 A1* | 12/2008 | Yang | H01L 23/5252 257/530 |
| 2009/0140382 A1* | 6/2009 | Gao | H01L 23/5256 257/529 |
| 2009/0206978 A1 | 8/2009 | Hwang et al. | |
| 2013/0009254 A1 | 1/2013 | Russ et al. | |
| 2013/0270559 A1 | 10/2013 | Hafez et al. | |

FOREIGN PATENT DOCUMENTS

| | | |
|---|---|---|
| TW | 200715528 | 6/1995 |
| TW | 200910525 | 5/1997 |
| TW | 201334119 | 10/2011 |

OTHER PUBLICATIONS

Search Report, mailed Aug. 1, 2016, for TW Patent Application No. 104110681.

International Preliminary Report on Patentability for PCT/US2014/037266 mailed Nov. 17, 2016, 7 pages.

* cited by examiner

NECKED INTERCONNECT FUSE STRUCTURE FOR INTEGRATED CIRCUITS

CLAIM OF PRIORITY

This application claims priority to PCT Patent Application Serial No. PCT/US14/37266, filed on 8 May 2014 and titled "NECKED INTERCONNECT FUSE STRUCTURE FOR INTEGRATED CIRCUITS", which is incorporated by reference in its entirety.

TECHNICAL FIELD

Exemplary embodiments of the invention generally relate to integrated circuits (ICs), and more particularly pertain to metal interconnect fuse structures.

BACKGROUND

Monolithic ICs generally comprise a number of transistors, such as metal-oxide-semiconductor field-effect transistors (MOSFETs), fabricated over a planar substrate, such as a silicon wafer. ICs often include at least one fuse. A fuse is a sacrificial device that may be employed to provide IC overcurrent protection, secure and IC, or otherwise program operation of an IC. A fuse starts with a low resistance and is designed to permanently create a non-conductive path when the current across the device exceeds a certain level.

Some fuse designs employ narrow interconnect metal line. As a high enough current passes through the thin metal line, the metal line melts and creates an open circuit. To have a low program current, the cross-section of the fuse needs to be small compared to other circuit conductors. Another approach leverages electromigration between two metal materials. When two or more conducting metals interface, momentum transfer between conduction electrons and metal ions can be made large where there is a non-uniform metal ion lattice structure. Above a certain current level, atoms move and create voids near the bimetal interface, thus creating an open circuit. For such a fuse architecture, the overlap area between metals and the electromigration properties of the metals determine the fuse program current.

As fuse architectures reliant on electromigration are generally incompatible with efforts to mitigate electromigration for sake of improved device reliability, metal-line based fuse architectures are advantageous. Also, with MOS transistor dimensions scaling from one technology generation to the next, it is desirable to scale down fuse size, as well as fuse program current. However, for interconnect metal line fuse elements, interconnect metal line resistance has trended up over recent IC technology generations. An increase in fuse resistance reduces current through a fuse element at a given supply voltage, making it more difficult to create an open fuse circuit (e.g., requiring a greater fuse program voltage).

Interconnect fuse architectures and associated fabrication techniques capable of lower program currents, and/or smaller fuse areas are therefore advantageous for advanced MOS ICs.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
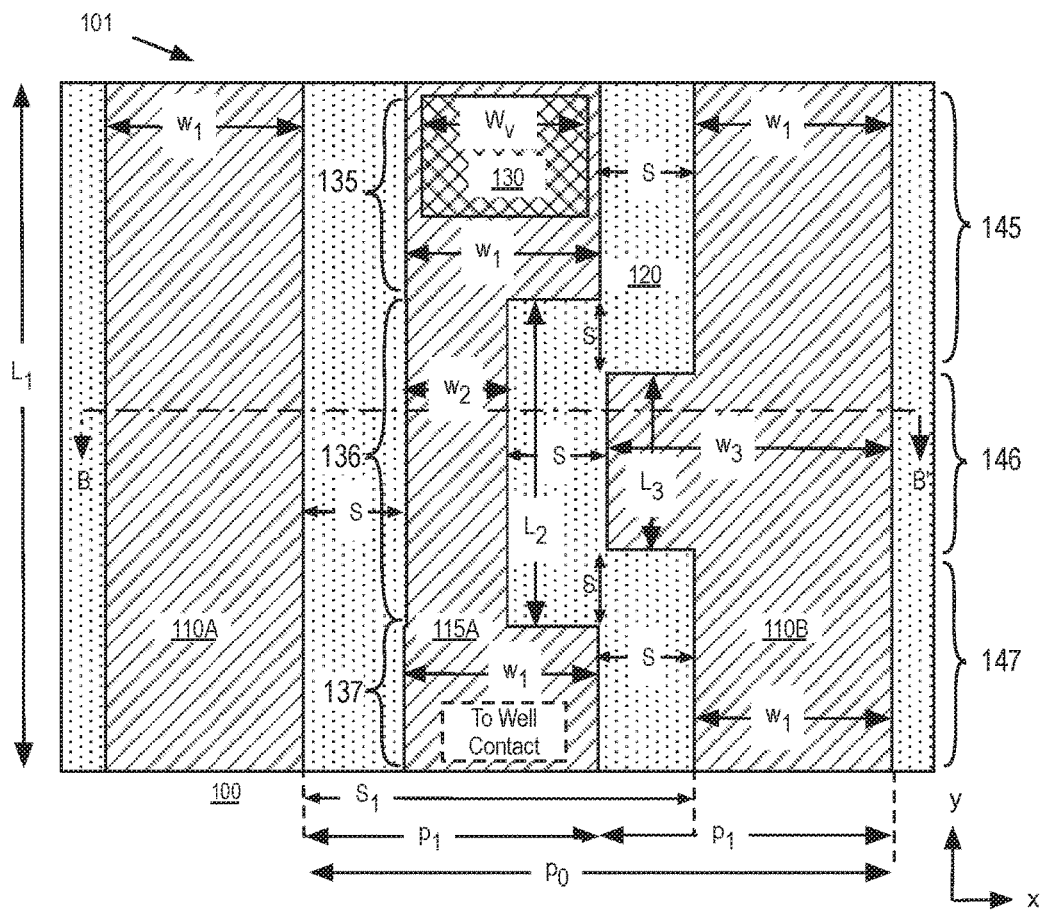
FIG. 1A is a plan view of a necked interconnect fuse structure, in accordance with an embodiment.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or to "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the exemplary embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Necked interconnect fuse structures, and fabrication techniques to form such fuse structures, are described herein. In embodiments, a necked interconnect fuse structure includes a planar conductive trace including both a nominal fuse segment having a nominal lateral width, and a necked fuse segment having a necked lateral width that is narrower than the nominal lateral width. Ends of the interconnect fuse separated by at least the necked segment are electrically connected to a fuse programming voltage/current source. The reduced lateral width of the necked fuse segment is more susceptible to failure than nominally dimensioned circuitry, forming an electrical open upon application of the programming voltage. The reduced lateral width of the necked fuse segment reduces current carrying capability of the fuse over an advantageously short interconnect line length, enabling the fuse circuit overall to be of a low total resistance. The low total resistance of the fuse circuit permits a low programming voltage (e.g., <1.8V) to drive sufficient current to open the necked fuse segment. The short length of the necked fuse segment also enables a compact fuse circuit as the location of the open failure is well controlled and contained to the necked fuse segment. In further embodiments, the nominal fuse segment has a lateral width that is at a given design rule for the given interconnect level. The necked fuse segment therefore has a sub-minimum (i.e., illegal) lateral width. Whereas the design rule ensures no opens in IC structures, the necked fuse segment being below the design rule by a predetermined amount is ensured to fail open upon application of the programming voltage, which in advantageous embodiments is below 1.8V.

In exemplary embodiments, a spacer-based double-patterning technique is employed to form the necked interconnect fuse structure. Such pitch-reduction techniques are typically optimized for the formation of large arrays of interconnect lines of a constant lateral width. In embodiments described herein however, mandrel patterning having a fixed first pitch further includes mandrel segments of differing lateral width such that subsequent spacer formation, mandrel removal, and conductive trace backfill forms both necked and nominal fuse segments.

Figure 1B:
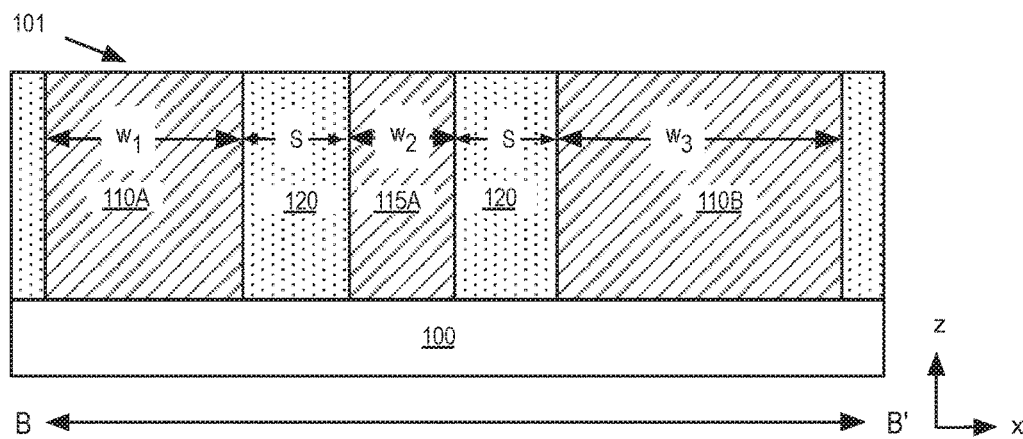
FIG. 1B is a cross-sectional view of the necked interconnect fuse structure illustrated in FIG. 1A, in accordance with an embodiment.

FIG. 1A is a plan view of a necked interconnect fuse structure 101, in accordance with an embodiment. FIG. 1B is a cross-sectional view of the necked interconnect fuse structure 101 along the b-b' plane illustrated in FIG. 1B, in accordance with a further embodiment. As shown in FIGS. 1A and 1B, conductive interconnect lines, stripes, or traces 110A, 110B, and 115A are embedded within a dielectric material 120 over an area of a substrate 100. Active IC devices (not depicted), such as transistors (e.g., MOSFETs), photodetectors (e.g., PIN diodes), lasers, memory cells, and the like are disposed in or on substrate 100. One or more passive device, such as resistors, capacitors, inductors, optical waveguides, and the like may also be disposed in or on substrate 100.

Substrate 100 may be any substrate suitable for forming a monolithically integrated electrical, optical, or microelectromechanical (MEM) device, generally referred to herein as an IC. Exemplary substrates include a semiconductor substrate, semiconductor-on-insulator (SOI) substrate, an insulator substrate (e.g., sapphire), or the like, and/or combinations thereof. In one exemplary embodiment, substrate 100 comprises a substantially monocrystalline semiconductor, such as, but not limited to, silicon. Other exemplary semiconductor substrate compositions include germanium, or group IV alloy systems; group III-V systems, such as GaAs, InP, InGaAs, and the like; or group III-N systems, such as GaN.

Interconnect lines 110A, 110B, and 115A may include any conductive material suitable interconnecting circuit nodes of an IC. In exemplary embodiments, interconnect lines 110A, 110B, and 115A are local interconnects are made of doped polysilicon. In other embodiments, lines 110A, 110B, and 115A are metallized. Exemplary metal compositions include, but are not limited to, copper (Cu), Tungsten (W), aluminum (Al), titanium (Ti), platinum (Pt), cobalt (Co), tantalum (Ta), and alloys thereof. Interconnect lines 110A, 110B, 115A may include an interconnect liner cladding a fill metal, or may be of a homogenous composition.

Interconnect lines 110A, 110B, 115A are illustrated as extending over a length $L_1$ in a first dimension (e.g., y). Length $L_1$ may represent a fraction of a total line length sufficient to illustrate the various fuse segments 135, 136, and 137 within the center interconnect line 115A. Over length $L_1$, interconnect lines 110A, 110B, 115A are substantially parallel. Over length $L_1$, interconnect line 110A has a constant nominal interconnect line lateral width $w_1$ in a second dimension (e.g., x). Nominal lateral width $w_1$ may be a minimum design rule CD for an interconnect line in a given interconnect level (e.g., metal 1, etc.). Interconnect line 110A has an inside edge separated from a nearest edge of interconnect line 115A by a nominal lateral space of dimension S, which may be a minimum design rule spacing for coplanar interconnect lines at the given interconnect level. As shown, the nominal space S is constant along the entire length $L_1$. Although $w_1$ and S may vary with technology node, in exemplary embodiments each ranges from 5 nm-60 nm. The nominal lateral width $w_1$ and nominal space S define a nominal pitch $p_1$ for the given interconnect level.

Dielectric material 120 disposed within space S may be any dielectric material known in the art to be suitable for electrical isolating interconnect lines 110A, 110B, and 115A from each other. Many materials are in use in the art, such as, but not limited to, silicon dioxide ($SiO_2$), silicon nitride ($Si_3N_4$), silicon oxynitride (SiON), low-k, and ultra low-k materials (e.g., carbon doped silicon dioxide/nitride, porous dielectrics, etc.). As illustrated in FIG. 2B, a top surface of the portion of dielectric material 120 is planar with a top surface of interconnect lines 110A, 110B, 115A.

Interconnect line 115A includes a fuse line between two electrical connections that intersect interconnect line 115 at opposite ends of a necked fuse segment 136. In the exemplary embodiment depicted in FIG. 1A, a via 130 serves as a first connection at a first end of necked fuse segment 136. A second electrical connection (not depicted), such as a second via or contact to substrate doped semiconductor well, is spaced apart from via 130 by at least necked fuse segment 136, to complete a fuse circuit node. In this exemplary embodiment, via 130 extends in a third dimension (e.g., dropping a z height from a higher interconnect level) to land on a nominal fuse segment 135, which also has the nominal interconnect line lateral width $w_1$. In further embodiments, electrical connections to a necked fuse intersect the nominal fuse segments (e.g., segments 135 and 137). In the exemplary embodiment shown in FIG. 1A, via 130 is fully landed on nominal fuse segment 135. Via 130 may also be unlanded, for example in embodiments where via width $w_v$ is too large relative to the nominal interconnect line lateral width $w_1$ to accommodate interlayer misregistration. Nominal fuse segment 135 is abutted to necked fuse segment 136, which is further abutted to nominal fuse segment 137. Nominal fuse segment 137 has the nominal lateral width $w_1$, which may be constant along the remaining line length to the second electrical connection.

Necked fuse segment 136 has a lateral width $w_2$ that is smaller than the nominal lateral width $w_1$. In embodiments, a necked fuse segment has a lateral width $w_2$ that is smaller than the nominal lateral interconnect $w_1$ by an amount at least equal to the spacing S, as illustrated in FIG. 1A for example. In this exemplary embodiment $w_2$ is approximately 50% of $w_1$, however $w_2$ may vary from 90% of $w_1$ to 25% of $w_1$, or less. A larger difference between $w_1$ and $w_2$ advantageously decreases fuse programming voltage. In the exemplary embodiment where the nominal interconnect line lateral width $w_1$ is at the design rule for the minimum lateral width for the given interconnect level, $w_2$ is a lateral width that is below the design rule. Such a violation may be accommodated/permitted with an automated layout validation process based on one or more predetermined rules (e.g., associated with a fuse circuit netlist, etc.). Necked fuse segment 136 has lateral width $w_2$ over a length $L_2$, which may vary with implementation. A smaller length $L_2$ advantageously maintains lower total fuse resistance while a larger length $L_2$ advantageously improves dimensional control of $w_2$.

In the exemplary embodiment, fuse line 115A has a second edge laterally separated from an inside edge of interconnect line 110B by another space of dimension S. Notably, the dimension S is maintained over both necked fuse segment 136, and nominal fuse segments 135, 137. Each of the interconnect lines 110A and 110B are therefore substantially equidistant from opposite edges of both nominal fuse segments 135, 137 and necked fuse segment 136. To maintain this constant spacing, interconnect line 110B includes a wider line segment 146 that has a lateral width $w_3$, which is wider than the nominal interconnect line lateral width $w_1$. Wider line segment 146 is abutted between two nominal line end segments 145, 147, which each have the nominal interconnect line lateral width $w_1$. Interconnect line 110B has the wider lateral width $ww_3$ over a line length $L_3$, which is less than the necked fuse segment length $L_2$. While the difference between lengths $L_3$ and $L_2$ may vary with implementation, in the exemplary embodiment $L_3$ is less than $L_2$ by approximately twice the spacing S (i.e., within 5% of S). In further embodiments, wider line segment 146 is aligned (e.g., along the y-dimension) with necked fuse segment 136. More specifically, the centerline of wider line segment 146 (e.g., at ½ $L_3$) is aligned to a centerline of necked fuse segment 136 (e.g., at ½ $L_2$).

In embodiments, within fuse structure 101, interconnect lines 110A and 110B have a fixed pitch $p_0$. The pitch between interconnect line 115A and each of the adjacent interconnect lines 110A, 110B is $p_1$, which is substantially equal to one half of $p_0$ for line segments that are at the nominal lateral interconnect line width $w_1$. With space S maintained at a predetermined value, the structural relationship between the interconnect lines 110A, 110B, and 115A may be fully defined by the pitch $p_0$, lateral line widths of the interconnect lines 110A and 110B (e.g., $w_1$ and $w_3$), and space S, which when twice subtracted from the lateral spacing $S_1$ between interconnect lines 110A and 110B provides the lateral width of the fuse segments 135, 136, and 137. Because the interconnect line 110A is of the nominal lateral width $w_1$ along the line length $L_1$ extending adjacent to both necked fuse segment 136 and nominal fuse segments 135, 137, the necked lateral width $w_2$ is narrower than the nominal lateral width $w_1$ by an amount substantially equal to the amount by which the wider lateral width $w_3$ is larger than the nominal lateral width $w_1$.

Figure 2:
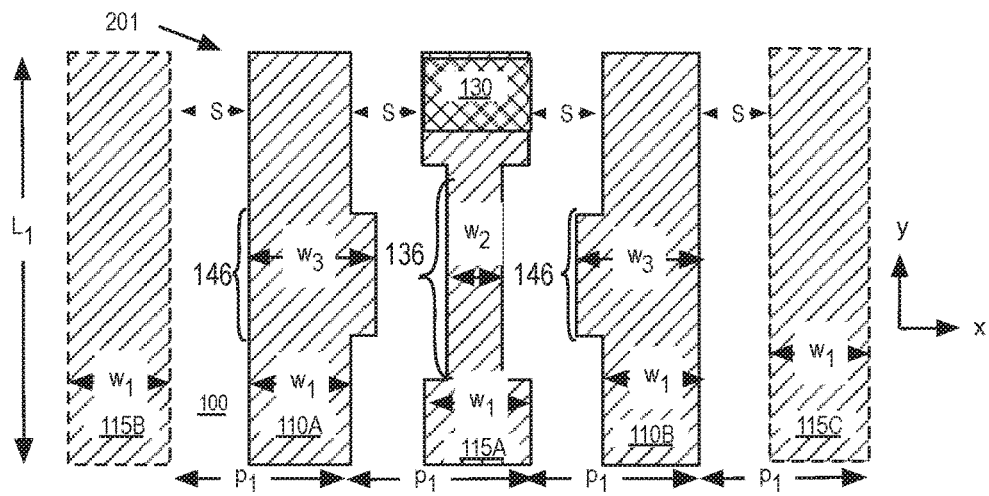
FIGS. 2, 3, 4A, 4B, and 5 are plan views of necked interconnect fuse structures, in accordance with embodiments.

FIG. 2, is plan view of necked interconnect fuse structure 102 that further illustrates the dependence of the fuse line segment width on the adjacent interconnect lines. In accordance with this alternate embodiment, each of interconnect lines 110A and 110B includes at least one wider line segment 146. For this embodiment the lateral width $w_3$ is larger than the nominal lateral width $w_1$ by amounts that sum to substantially equal to the difference between the necked lateral width $w_2$ and the nominal lateral width $w_1$. For the structure 201, the necked fuse segment 136 has a given lateral width $w_2$, and for example the same effective current-carrying cross-section as for the fuse structure 101. However, fuse structure 101 has the advantage of lateral width $w_3$ being larger than the nominal lateral width $w_1$ by a greater amount (e.g., equal to approximately the spacing S) and therefore may imaged by lithography (e.g., lower mask error enhancement factor) more readily than fuse structure 201 where lateral width $w_3$ differs from the nominal width $w_1$ by a lesser amount (e.g., less than S).

FIG. 2 further illustrates how a fuse structure 201 may be inserted within an array of interconnect lines or stripes, having the fixed pitch $p_1$. Beyond interconnect lines 110A, 110B, additional interconnect lines have a fixed lateral width $w_1$, as shown for lines 115B and 115C bordering fuse structure 102. Fuse structure 102 may be similarly inserted within an array of interconnect lines, with interconnect line 110A representing a first of an array of interconnect lines having fixed lateral width $w_1$.

Figure 3:
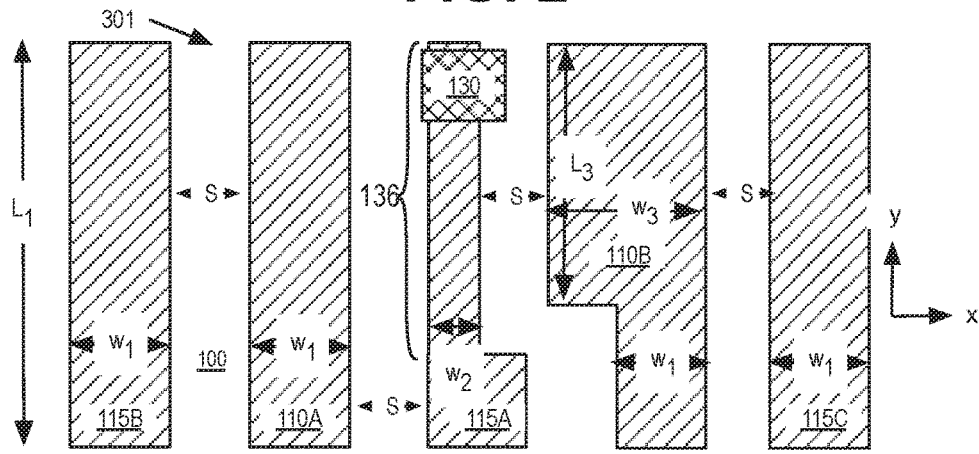

While fuse structure 101 may provide a low fuse circuit resistance advantageous for low fuse programming voltage, FIG. 3 illustrates an alternative fuse structure 301 where via 130 intersects necked a fuse segment 136 having a lateral width $w_2$ that is smaller than the via width. Higher fuse circuit resistance may be expected for structure 301 than for fuse structure 101, but depending on the implementation, lithographically imaging of interconnect line 110B may be significantly improved by maintaining the greater lateral width $w_3$ over the longer length $L_3$.

Figure 4A:
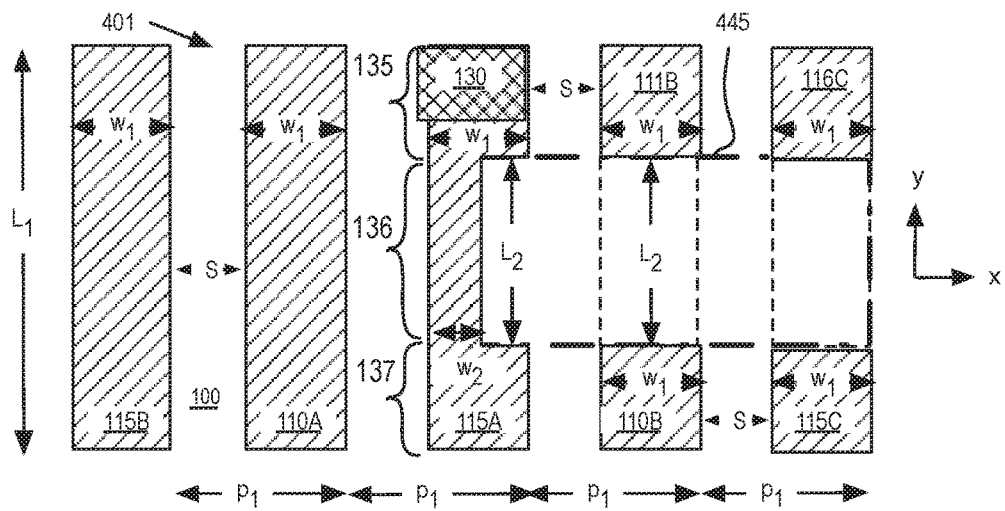

FIG. 4A is a plan view of a fuse structure 401, in accordance with another alternative embodiment. Fuse structure 401 includes interconnect line 115A that again includes necked fuse element 136, of necked lateral width $w_2$, abutting nominal fuse elements 135 and 137, of nominal lateral width $w_1$. Adjacent to a first edge of interconnect line 115A is interconnect line 110A, which has a fixed nominal lateral width $w_1$ along the length $L_1$ substantially as was described in the context of FIG. 1A. Adjacent to the opposite edge of interconnect line 115A are bifurcated lines 110B and 111B that are aligned in one dimension (e.g., y-dimension) with the nominal fuse elements 135 and 137. Bifurcated line segments 110B and 111B both have the nominal interconnect line lateral width $w_1$, and are further aligned with each other in the x-dimension. Bifurcated lines 110B and 111B are made of the same material(s), such as any of those previously described for interconnect lines. Interconnect lines 110A, 115A, as well as bifurcated lines 110B, 111B, have a same fixed pitch $p_1$ and are spaced apart by a space of dimension S, substantially as described above in the context of fuse structure 101. Fuse structure 401 includes a field region 445 aligned with necked fuse segment 136. Field region 445 may be filled for example with dielectric material 120 having any of the compositions previously described in the context of fuse structure 101. As further illustrated in FIG. 4A, field region 445 has a length $L_2$ that is equal to the length of necked region 136 in contrast to the interconnect line segments of larger lateral width over a relatively shorter line length $L_3$ described in embodiments above. In further embodiments, a fuse structure may include a plurality of interconnect lines within an array bifurcated by a field region. For example, as illustrated in FIG. 4A, field region 445 separates bifurcated lines 115C and 116C as well as bifurcated lines 110B and 111B.

Figure 4B:
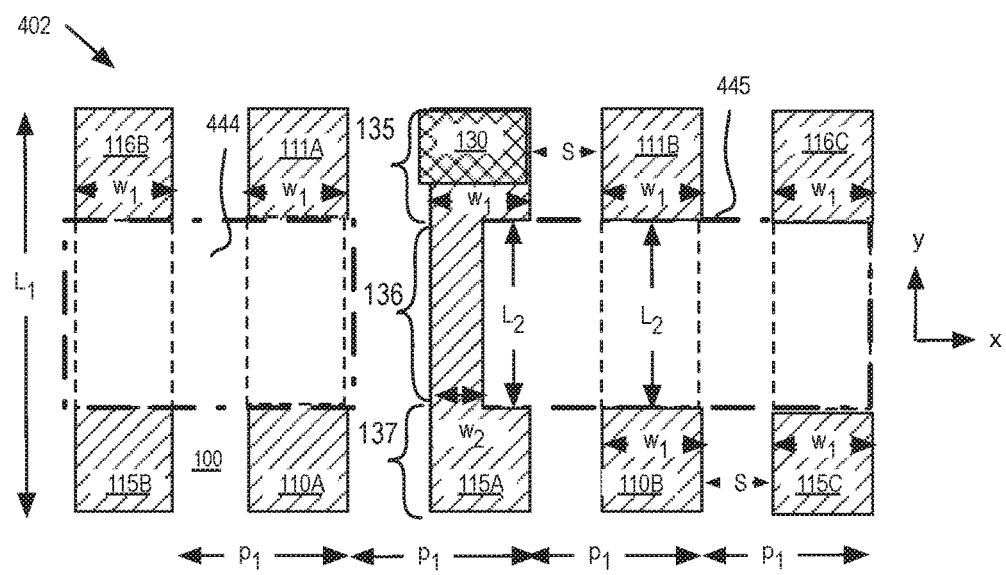

FIG. 4B is a plan view of a fuse structure 402, in accordance with another alternative embodiment. Fuse structure 402 includes interconnect line 115A that includes necked fuse element 136, of necked lateral width $w_2$, abutting nominal fuse elements 135 and 137, of nominal lateral width $w_1$. Adjacent to a first edge of interconnect line 115A are bifurcated interconnect line segments 110A and 111A that are aligned in one dimension (e.g., y-dimension) with the nominal fuse elements 135 and 137. Adjacent to the opposite edge of interconnect line 115A are bifurcated line segments 110B and 111B that are aligned in one dimension (e.g., y-dimension) with the nominal fuse elements 135 and 137. Bifurcated line segments 110A, 111A and 115B, 111B all have the nominal interconnect line lateral width $w_1$. Bifurcated lines 110A, 111A, 110B, 111B are made of the same material(s), such as any of those previously described for interconnect lines. Bifurcated lines 110A, 111A, 110B, 111B, have a same fixed pitch $p_1$ and are spaced apart by a space of dimension S, substantially as described above in the context of fuse structure 101. Fuse structure 402 includes a field regions 444, 445 aligned with necked fuse segment 136. Field regions 444, 445 may be filled for example with dielectric material 120 having any of the compositions previously described in the context of fuse structure 101. As further illustrated in FIG. 4B, field regions 444, 445 have a length $L_2$ that is at least equal to the length of necked region 136 in contrast to the interconnect line segments of larger lateral width over a relatively shorter line length $L_3$ described in embodiments above. Fuse structure 402 therefore advantageously bifurcates interconnect lines adjacent to the fuse length L2 so that any fuse open is unlikely to form a electrically conductive bridge to a neighboring interconnect line. Such a technique may be similarly applied to any of the fuse structures 101, 201, or 301. To provide even more field area around a necked fuse length, a fuse structure may include a plurality of interconnect lines within an array bifurcated by a field region. For example, as illustrated in FIG. 4B, field regions 444, 445 separate bifurcated lines 115B, 116B and 115C, 116C, respectively.

Figure 5:
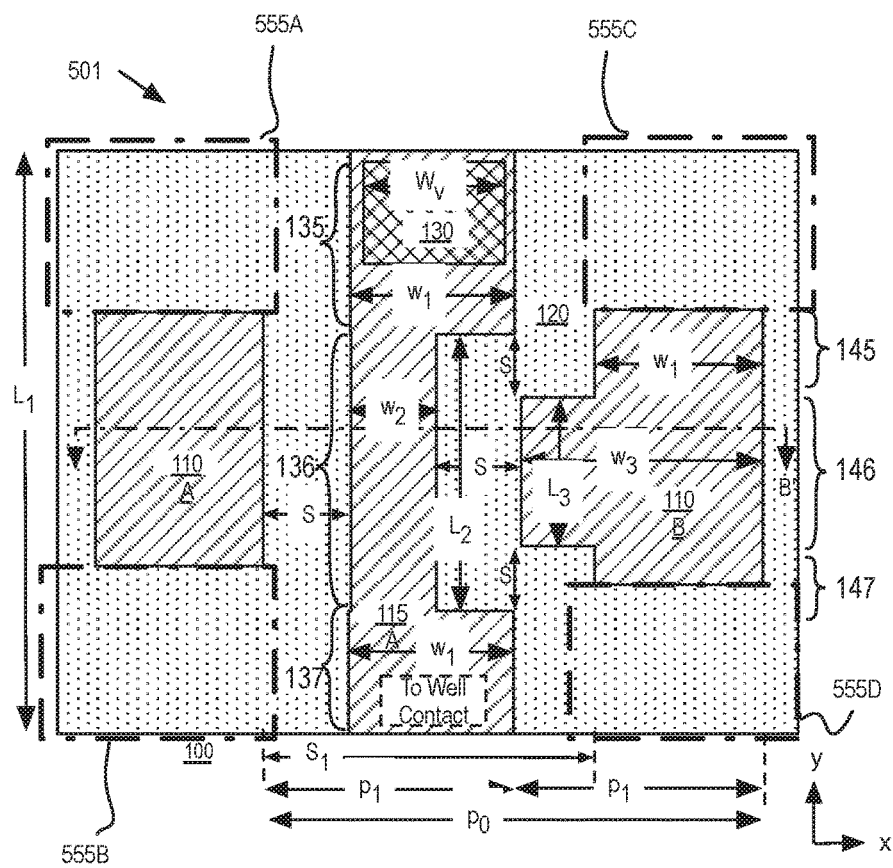

In embodiments, a necked interconnect fuse structure includes a first interconnect line of nominal and wide lateral widths, adjacent interconnect fuse segments of nominal and necked lateral widths that are complementary to the first interconnect line, and one or more field region. For such embodiments, the field regions(s) may be utilized to modify a necked fuse structure as desired. FIG. 5, for example, illustrates a necked fuse structure 501 that includes field regions 555A, 555B, 555C, and 555D that reduce the lengths of interconnect lines 110A, and 110B. In contrast to the embodiment illustrated in FIG. 4, where the lateral width of necked fuse segment 136 was dependent on location of field region 455, the lateral width of necked fuse segment 136 in fuse structure 501 is dependent on the adjacent interconnect lines 110A and 110B substantially as described above in the context of fuse structure 101 (e.g., FIG. 1A). As such, fuse structure 501 has all the features fuse structure 101, but benefits from an additional mask (e.g., a blocking mask that may be double-patterned with a mask utilized to form interconnect lines 110A and 110B, as described further below) to further limit the footprint of fuse structure 501.

Figure 6:
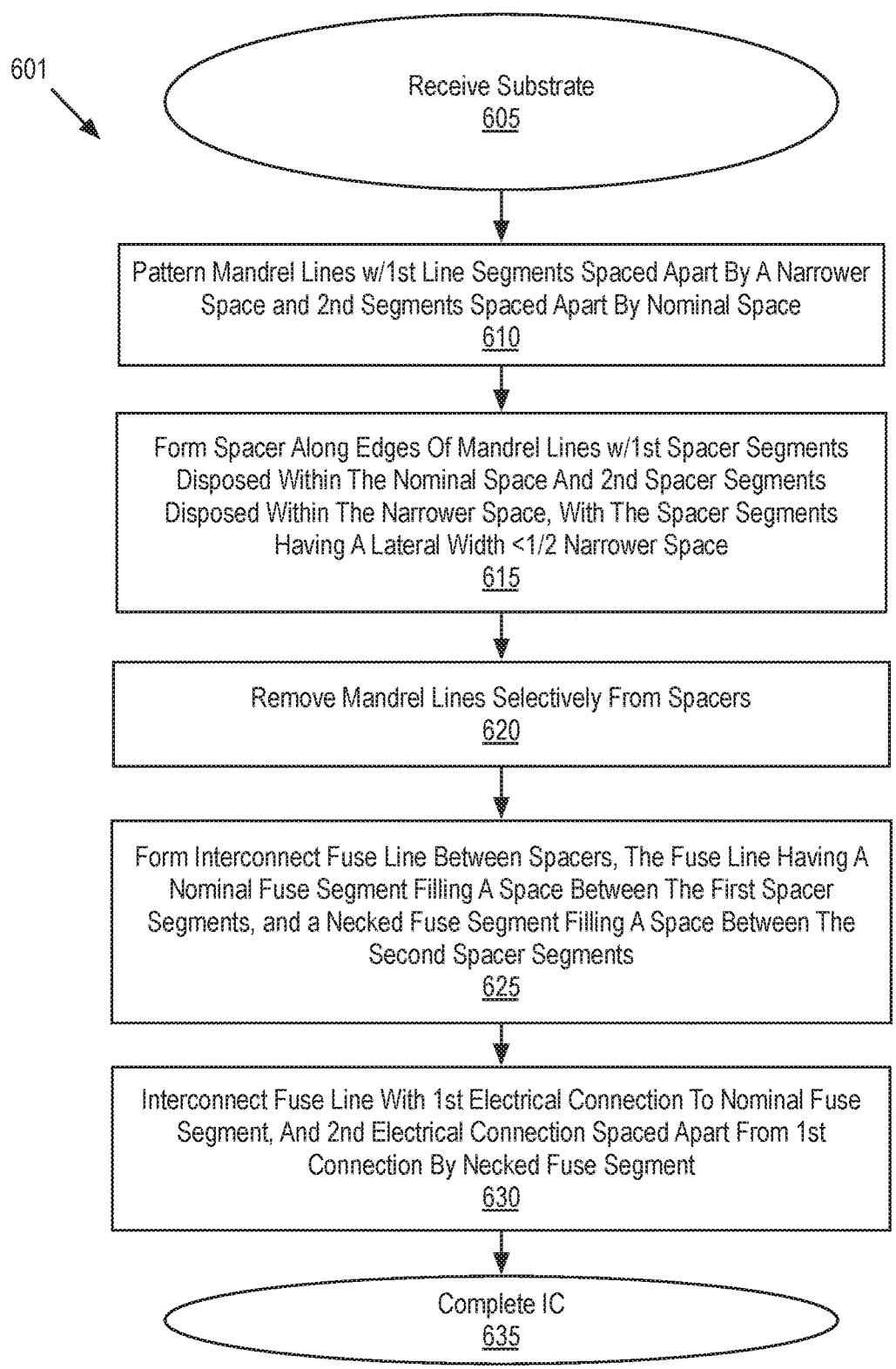
FIG. 6 is a flow diagram illustrating a method of forming a necked interconnect fuse structure, in accordance with an embodiment.

FIG. 6 is a flow diagram illustrating a method 601 for forming an IC interconnect fuse structure including a necked fuse segment, in accordance with one exemplary embodiment. Method 601 is one example of a spacer-based double patterning method that may be practiced to fabricate the interconnect fuse structures 101, 201, 301, 401, or 501 described above. FIGS. 7A, 7B, 7C, 7D, 7E, 7F, 7G, and 7H are plan and cross-sectional views of a necked interconnect fuse structure evolving as selected operations in the method 601 are performed, in accordance with an embodiment. Reference is made to FIG. 7A-7H to further illustrate the description of FIG. 6.

Referring first to FIG. 6, method 601 begins with receiving a substrate at operation 605. In the exemplary embodiment, the substrate received includes a mandrel material layer disposed on a top surface of the substrate. The mandrel material layer may be any material known in the art to provide suitable patterning characteristics, such as, but not limited to, polycrystalline semiconductor (e.g., polysilicon), silicon-based dielectrics (e.g., $SiO_2$, $Si_3N_4$, SiON, carbon-doped oxide, etc.), other glasses (e.g., MSQ, etc.), or metals (e.g., aluminum, etc.).

At operation 610, a pair of adjacent mandrel lines is patterned in the mandrel material. In an embodiment, the mandrel lines are patterned to have first mandrel line segments laterally spaced apart by a narrower space and second mandrel line segments laterally spaced apart by a nominal space that is larger than the narrower space. In further embodiments, the mandrel patterning includes patterning a nominal mandrel segment of nominal lateral width abutted to a wider mandrel segment having a wider lateral width than the nominal lateral width by an amount substantially equal to the difference in lateral width of the nominal space and narrower space. For example, as further illustrated in FIGS. 7A and 7B, mandrel lines 710A, 710B are patterned, at a nominal line pitch of $p_0$. Mandrel line 710A has a fixed nominal lateral width of $w_1$, while mandrel line 710B includes both a wide line segment 736 of lateral width $w_3$, and nominal line segments 735, 736 of the nominal lateral width of $w_1$. The pair of adjacent mandrel lines 710A, 710B are then spaced apart by a nominal space $S_0$, and a narrower space $S_0'$. In another embodiment, mandrel lines are patterned to have first mandrel line segments all of a same lateral width, and are laterally spaced apart by a constant space.

Patterning of mandrel lines at operation 610 with any photolithographic printing and etching process, such as, but not limited to a first photoresist masking and lithographic printing process followed by an anisotropic etching process that etches through at least a partial thickness of the mandrel material. In the exemplary embodiment illustrated in FIG. 7B, the etch process etches through the full thickness of the mandrel material. A suitable etch process is dependent on the chosen mandrel material. In further embodiments, multiple lithographic printing operations may be employed at operation 610. For example, a double patterning process may be utilized where a first patterning process may print an array of lines into a first photoresist, and a second patterning process may print a blocking pattern into a second photoresist applied over the first photoresist to avoid forming portions of the lines in the array (e.g., to bifurcate lines with a field region disposed adjacent to where an interconnect fuse will be formed). The mandrel material unprotected by the first photoresist, as modified by the second photoresist, may then be etched.

Figure 7A:
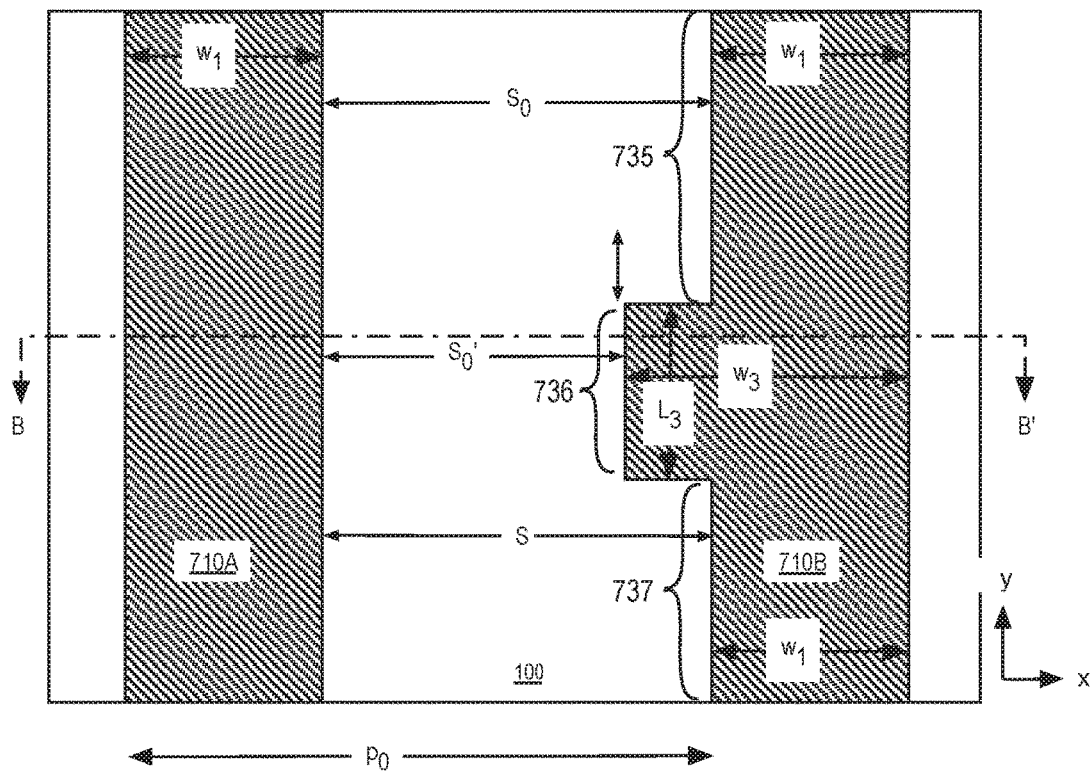
FIGS. 7A, 7B, 7C, 7D, 7E, 7F, 7G, 7H, and 7I are plan and cross-sectional views of a necked interconnect fuse structure evolving as selected operations in the method depicted in FIG. 6 are performed, in accordance with an embodiment.
Figure 7B:
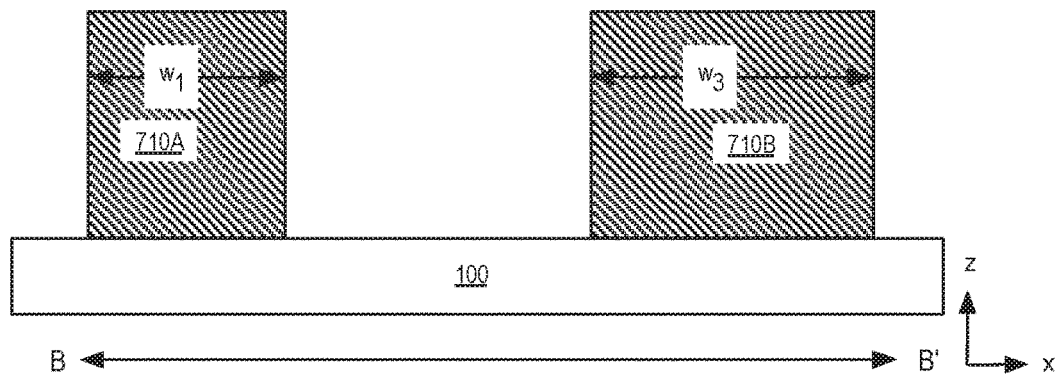
Figure 7C:
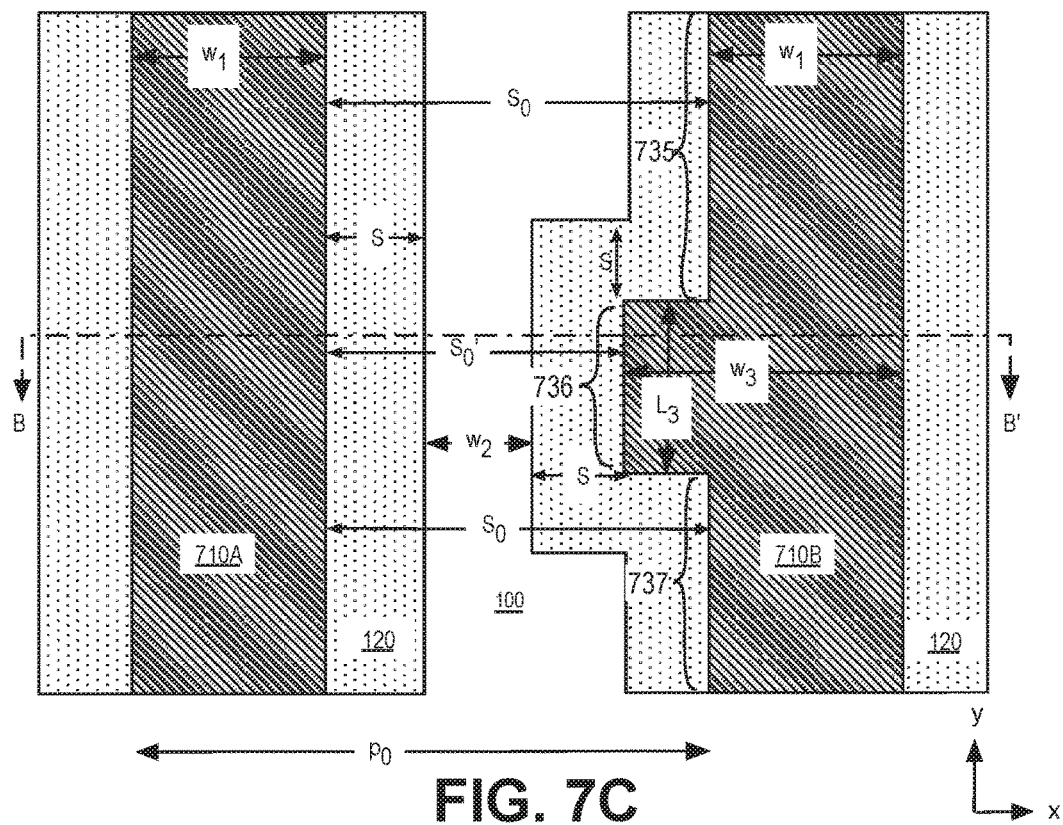
Figure 7D:
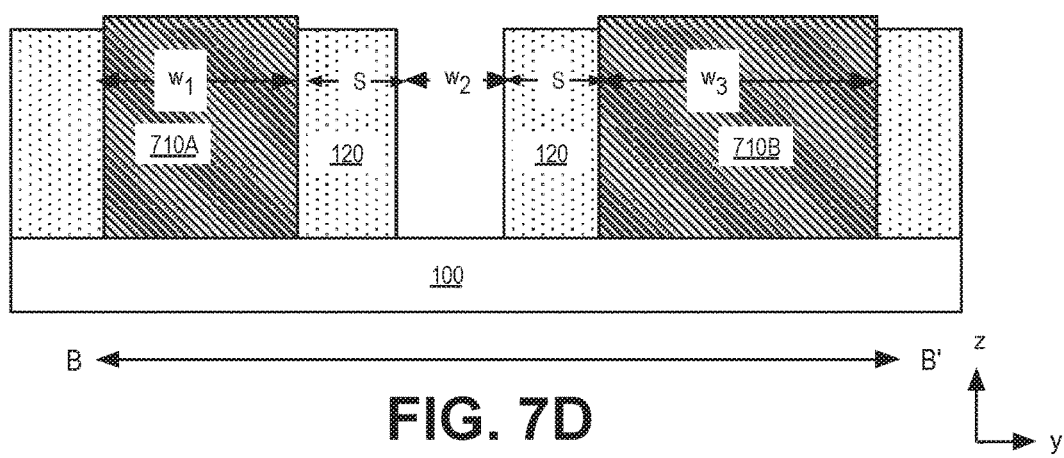
Figure 7E:
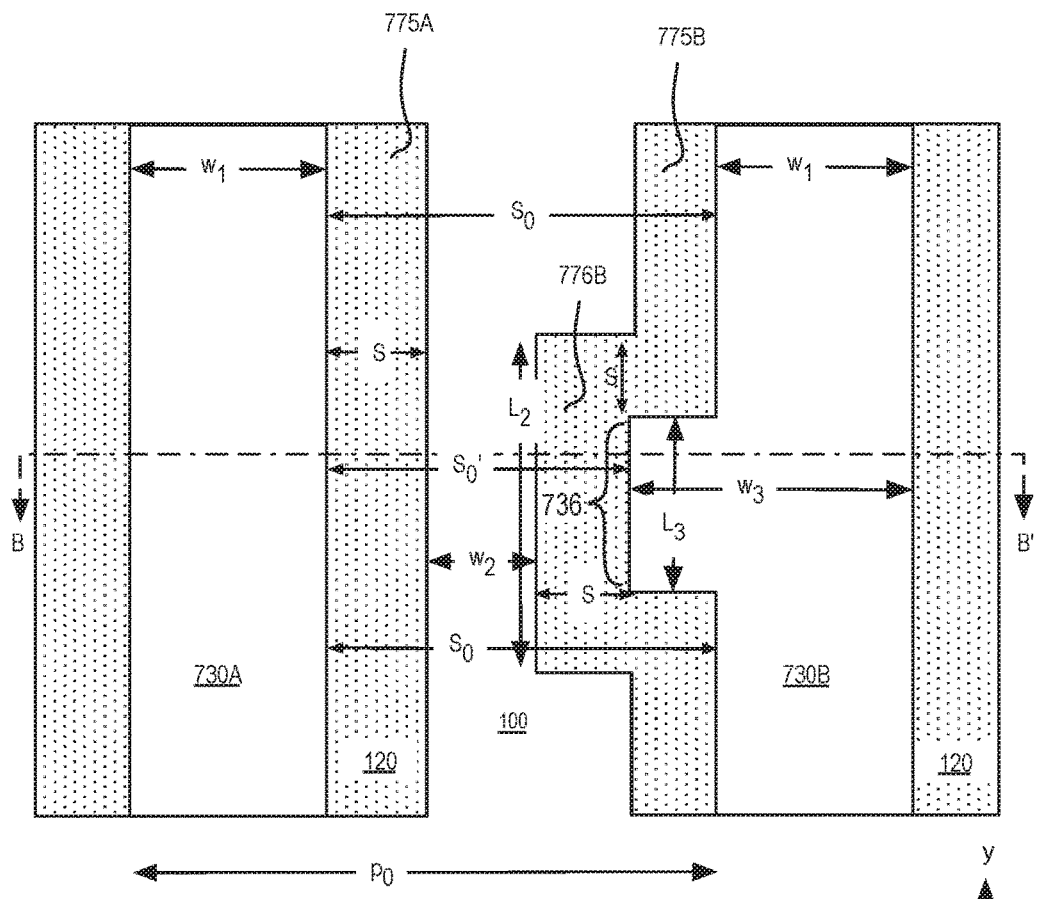
Figure 7F:
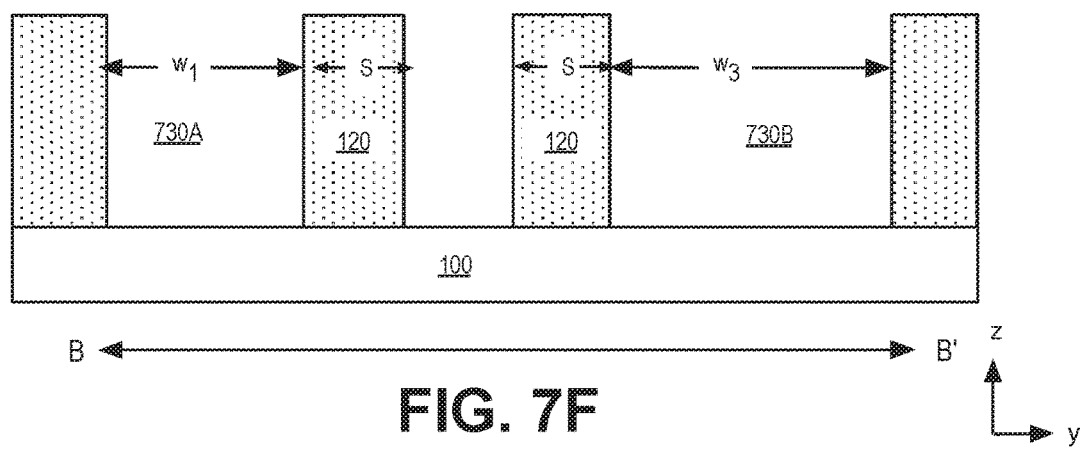
Figure 7G:
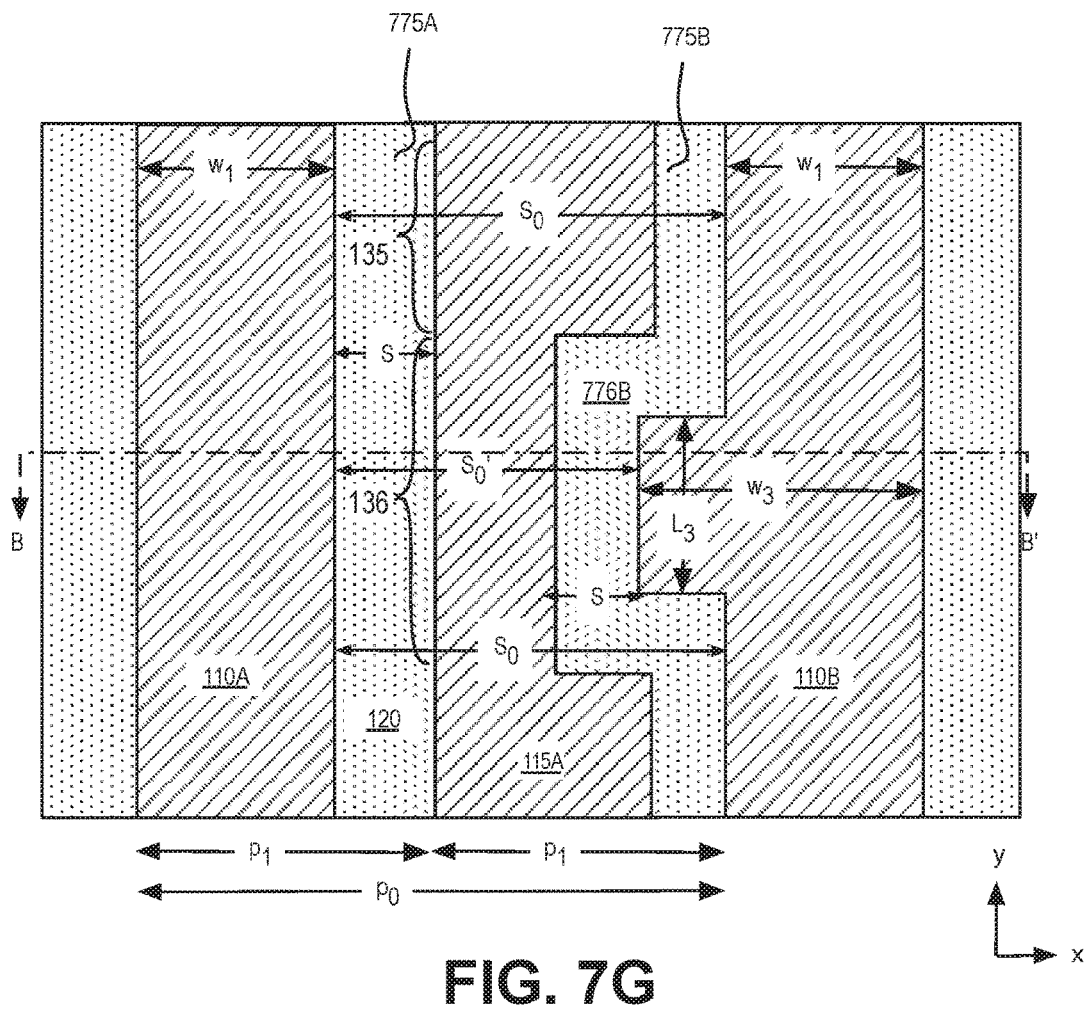
Figure 7H:
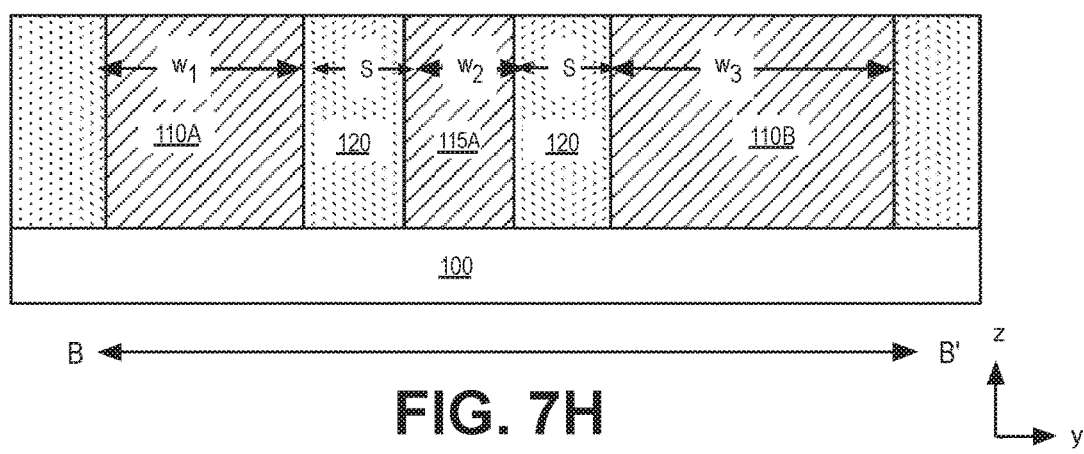

Returning to FIG. 6, method 601 proceeds to operation 615 where a spacer is formed along edges of the mandrel lines and/or field regions protected during the mandrel line etch. The spacer includes first spacer segments disposed within the nominal space between mandrel lines and second spacer segments disposed within the narrower space between mandrel lines. These spacer segments all have a lateral width that is less than one half the narrower space, ensuring a gap or space will remain between adjacent spacer segments. Many spacer formation processes art available for a variety of materials and determined of the spacer lateral width may be readily determined for a given selection of process parameters. Spacer formation may entail blanket deposition of a spacer material of a predetermined thickness, and an anisotropic etch of the spacer material. The spacer material may be any material amenable to a sufficiently anisotropic etch to form a spacer of a controlled lateral width without the aid of an overlying etch mask. In an exemplary embodiment, the spacer material is of a composition distinct from the mandrel material. In the embodiment further illustrated in FIGS. 7C and 7D, dielectric 120 forms a spacer of lateral width S along edges of mandrel lines 710A, 710B. Dielectric 120 may be blanket deposited over mandrel lines 110A, 110B and intervening regions of substrate 100 and then etched back to be "self-aligned" to mandrel lines 710A and 710B as a direct result of the mandrel line topography (step-height), the anisotropic nature of the etch, and a limited over etch duration. As shown in FIGS. 7C and 7D, spacer width S is less than half the narrower spacer $S_0'$ between mandrel lines 710A, 720B, leaving a gap or space between adjacent spacer segments of lateral width $w_2$.

Returning to FIG. 6, mandrel lines are selectively removed from the spacer(s) at operation 620. An etch process selective to the mandrel material composition may be utilized at operation 620 to remove the mandrel lines at a rate sufficiently higher than that at which the spacer material is removed. In the example further illustrated in FIGS. 7E and 7F, mandrel lines 710A, 710B are completely removed, forming recesses 730A, 730B separated from each other by two spacer lines 775A and 775B including a predetermined z-height (thickness) of dielectric 120. Nearest edges of spacer lines 775A and 775B are separated by a space of lateral width $w_2$ along a spacer segment 776B having a length $L_2$ that is greater than the wide mandrel line length $L_3$ by approximately twice the spacer lateral width S.

Returning to FIG. 6, at operation 625 an interconnect fuse line is formed between the nearest edges of the spacers. The fuse line has a nominal fuse segment, filling a space between first spacer segments. The fuse line has a necked fuse segment abutted to the nominal fuse segment. The necked fuse segment fills the space between the second spacer segments. In embodiments, operation 625 entails backfilling a conductive material into recesses between spacer lines to form an interconnect line with the necked fuse segment. Any conventional conductive material (e.g., metal) backfill process may be utilized at operation 625. For example, a metal damascene process including a blanket or selective metal deposition (e.g., Cu plating) followed by a planarization operation (e.g., Cu polish) may be performed at operation 625. In further embodiments, at least a pair of interconnect lines are formed currently with formation of the fuse line by further backfilling the recesses from where mandrel lines were removed. The three interconnect lines formed include a pair of outside interconnect lines equidistant from a center interconnect line that includes line segments of lateral widths complementary to those of either or both the outside interconnect lines. In the example further illustrated in FIGS. 7G and 7H, interconnect lines 110A, 110B are backfilled into the mandrel recesses while interconnect line 115A is backfilled into an intervening recess between the spacer lines. The lithographically printed line pitch $p_0$ is thereby reduced to an interconnect line pitch $p_1$. Interconnect line 115A includes necked fuse segment 136 filling the space adjacent to spacer segment 776B, and a nominal fuse segment 135.

Figure 7I:
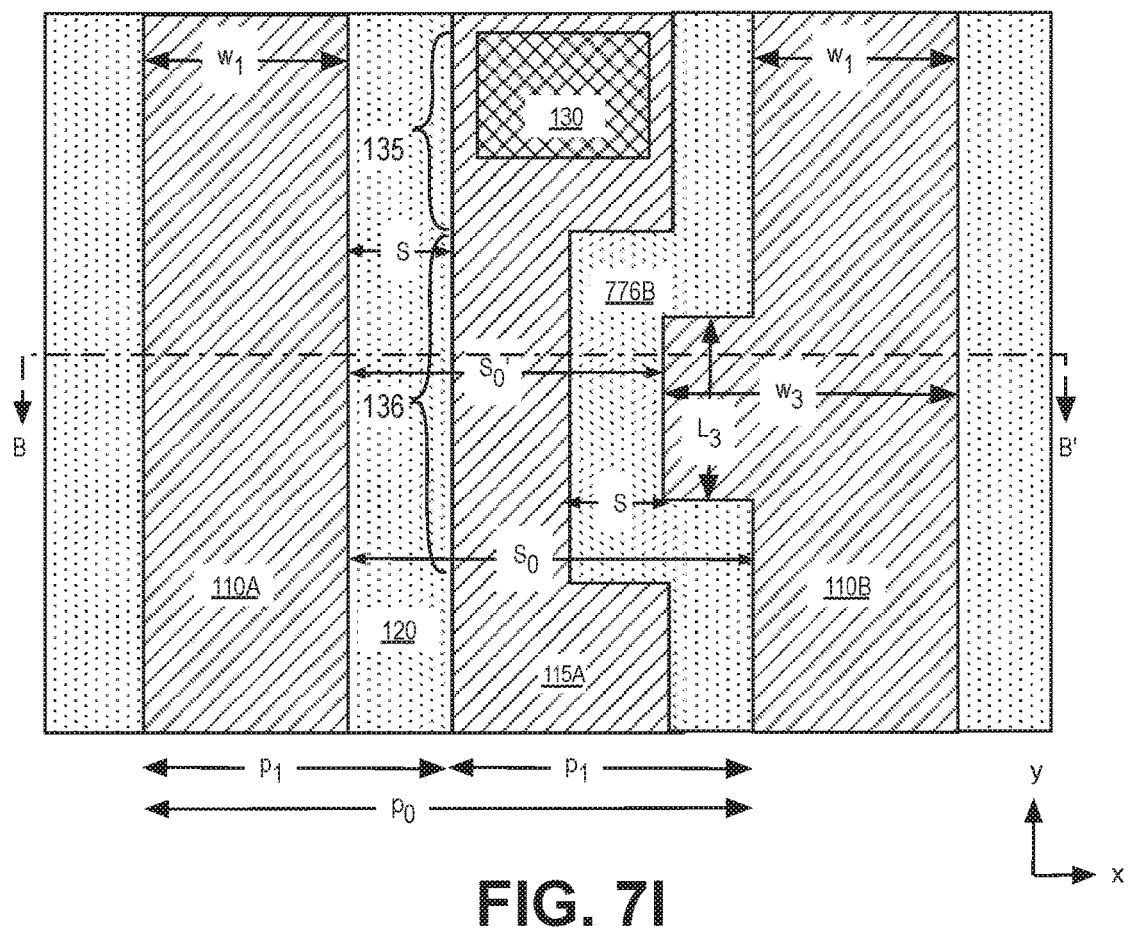

Returning to FIG. 6, method 601 continues with interconnecting the fuse line. A first electrical connection is made to the nominal fuse segment, and a second electrical connection is spaced apart from the first connection by at least the necked fuse segment. The two interconnections may be made at different points in method 601. For example, a first electrical connection may be made by overlaying a first end of the fuse line over an existing contact exposed in a surface of the substrate. The substrate contact may for example extend to a doped semiconductor well contact. A second electrical connection may be made by dropping a conductive via to a second end of the fuse line. Alternatively, two electrical connections may be made concurrently to either a higher interconnect level (e.g., with two conductive vias landing on opposite ends of the fuse line), or to a lower substrate level (e.g., to isolated doped semiconductor well contacts, etc.). FIG. 7I illustrates an exemplary embodiment where via 130 is formed, for example by any anisotropic etch, in a dielectric material deposited over interconnect line 115A. The via opening is then filled with a metal, for example by any damascene process. Method 601 then ends with completion of the IC following any conventional fabrication process.

Figure 8:
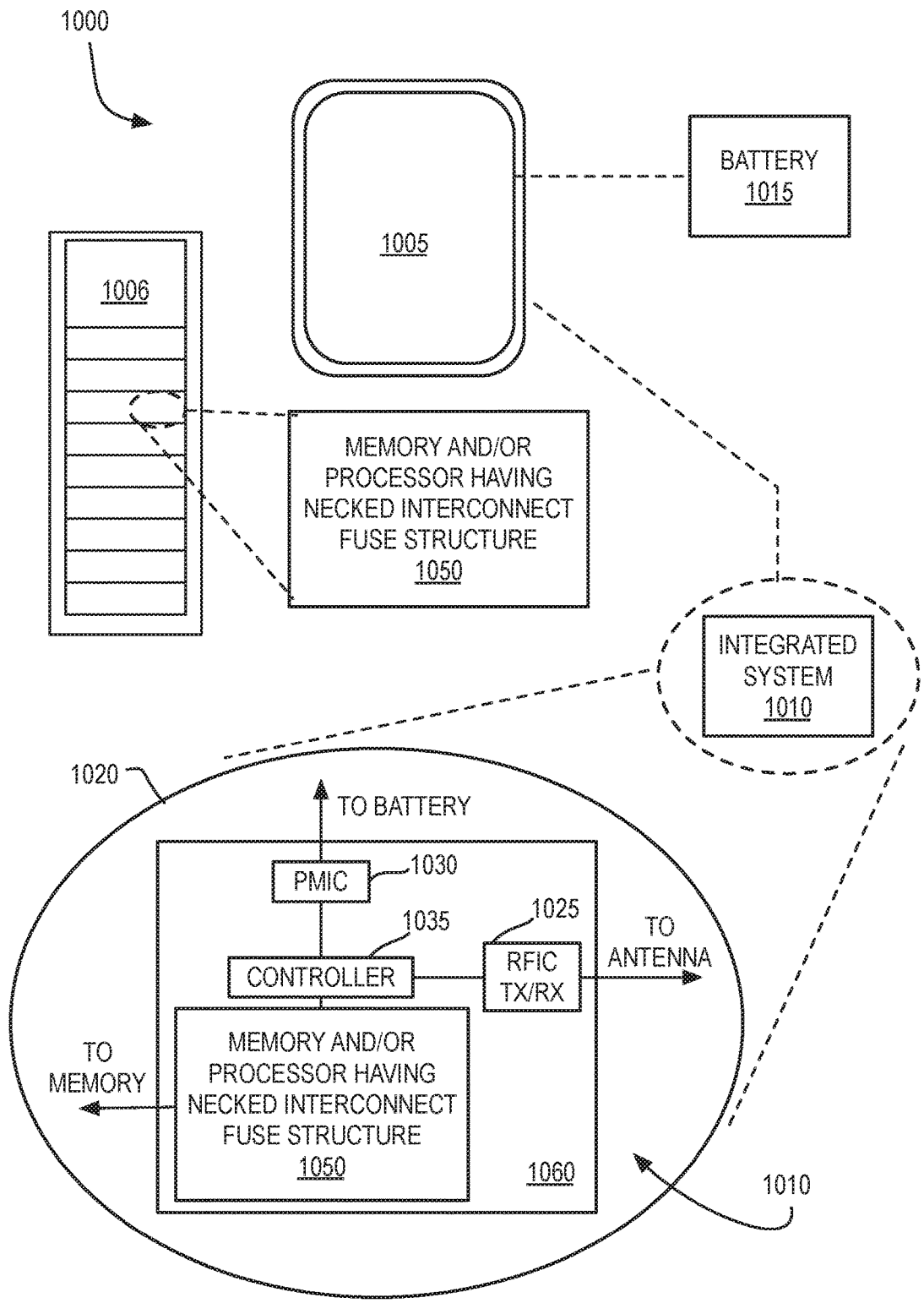
FIG. 8 illustrates a mobile computing platform and a data server machine employing a necked interconnect fuse structure in accordance with embodiments.

FIG. 8 illustrates a system 1000 in which a mobile computing platform 1005 and/or a data server machine 1006 employs an IC including a necked interconnect fuse structure in accordance with embodiments. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a self-aligned, selective via post, for example as describe elsewhere herein. The monolithic IC 1050 may be further coupled to a board, a substrate, or an interposer 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 9:
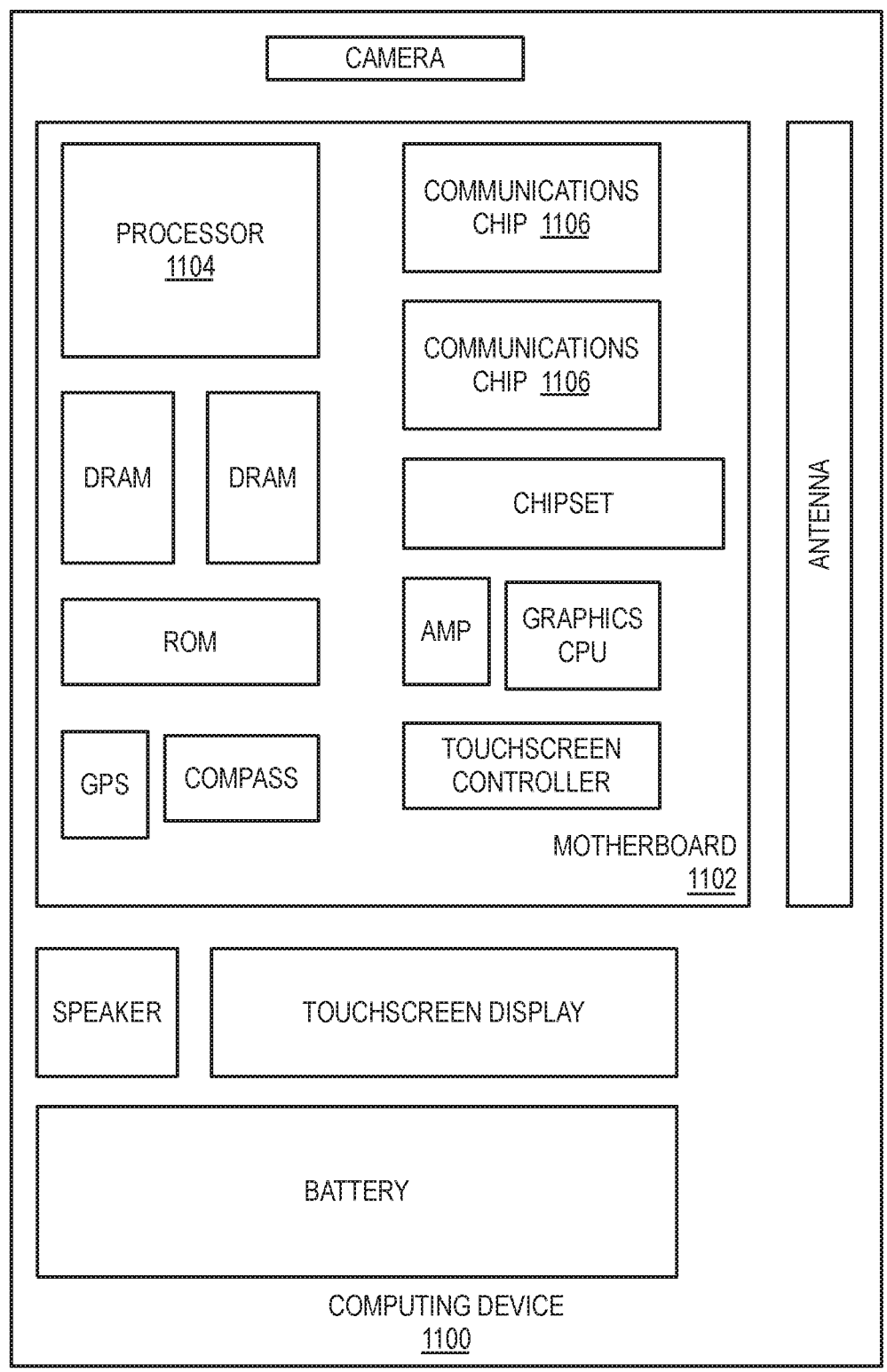
FIG. 9 is a functional block diagram of an electronic computing device, in accordance with an embodiment.

FIG. 9 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate a necked interconnect fuse structure in accordance with embodiments. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiment, an integrated circuit (IC) fuse structure includes an interconnect fuse line disposed over a substrate, the fuse line comprising a nominal fuse segment abutted to a necked fuse segment, wherein the nominal fuse segment has a nominal lateral width, and the necked fuse segment has a necked lateral width that is smaller than the nominal lateral width. The IC fuse structure includes a pair of interconnect lines disposed over the substrate and coplanar with the fuse line, and each of the interconnect lines spaced equidistant from opposite edges of both the nominal fuse segment and the necked line segment. The IC fuse structure includes a pair of electrical connections to the fuse line, the pair comprising a first connection to the nominal fuse segment, and a second connection spaced apart from the first connection by at least the necked fuse segment.

In furtherance of the one or more first embodiment, a first of the interconnect lines comprises a wider line segment abutted between two nominal line end segments having the nominal lateral width. The wider line segment has a wider lateral width that is larger than the nominal lateral width.

The wider line segment has a lateral length that is less than that of the necked fuse segment. The wider line segment is aligned along the length dimension to a center of the necked fuse segment.

In furtherance of the one or more first embodiment, the necked lateral width is narrower than the nominal lateral width by an amount substantially equal to the amount by which the wider lateral width is larger than the nominal lateral width. Alternatively, the first and second interconnect lines each comprise a wider line segment having a lateral width that is larger than the nominal lateral width by amounts that combine to substantially equal to the difference between the necked lateral width and the nominal lateral width.

In furtherance of the one or more first embodiment, the necked lateral width is narrower than the nominal lateral width by an amount substantially equal to the amount by which the wider lateral width is larger than the nominal lateral width.

In furtherance of the one or more first embodiment, the amount by which the wider lateral width is larger than the nominal lateral width is at least equal to a spacing between the nominal fuse segment and the two nominal line end segments.

In furtherance of the one or more first embodiment, the fuse line comprises the nominal fuse segment abutted to the necked fuse segment on a first end, and a second nominal fuse segment abutted to the necked fuse segment on a second end, and the pair of electrical connections intersect the nominal fuse segments.

In furtherance of the embodiment immediately above, the pair of electrical connections include a pair of conductive vias extending in a third dimension, a first via having a via width that is greater than the necked fuse segment width.

In furtherance of the one or more first embodiment, a second of the interconnect lines is of the nominal lateral width along a line length that is adjacent to both the nominal and necked fuse segments.

In one or more first embodiment, a method of fabricating an integrated circuit (IC) fuse structure includes forming over a substrate two mandrel lines having outside edges that are laterally spaced apart by at least a first distance, and having inside edges that are laterally spaced apart by a nominal space along a first segment and by a narrower space along a second segment.

The method further includes converting the two mandrel lines, with a pitch-reducing spacer-based patterning process, into three adjacent interconnect lines disposed within the first distance and spaced apart from each other by two equal distances, wherein the three lines include a center line that further comprises a nominal line segment of a nominal lateral width and a necked line segment of a narrower width. The method further includes interconnecting the center interconnect line with electrical connections that are spaced apart by at least the necked line segment.

In furtherance of the one or more first embodiment, forming the mandrel lines further includes patterning a pair of adjacent mandrel lines in a first material disposed over a substrate to have first mandrel line segments laterally spaced apart by a narrower space and second mandrel line segments laterally spaced apart by a nominal space that is larger than the narrower space. Converting the two mandrel lines, with a pitch-reducing spacer-based patterning process, into three adjacent interconnect lines further comprises forming a spacer along edges of the mandrel lines, the spacer including first spacer segments disposed within the nominal space and second spacer segments disposed within the narrower space, with the spacer segments having a lateral width that is less than one half the narrower space. Converting the two mandrel lines into three adjacent interconnect lines further comprises removing the pair of mandrel lines selectively from the pair of spacers. Converting the two mandrel lines into three adjacent interconnect lines further comprises forming an interconnect fuse line between the spacers, the fuse line having a nominal fuse segment filling a space between the first spacer segments and abutted to a necked fuse segment filling a space between the second spacer segments.

In furtherance of the embodiment immediately above, the method further includes further comprising forming a pair of interconnect lines concurrently with forming the fuse line by backfilling with a metal the regions from which the pair of mandrel lines were removed.

In furtherance of the embodiment immediately above, forming the fuse line further comprises backfilling the nominal and narrower spaces between the spacer with the metal, and the narrower space is formed to a lateral length that is larger than a lateral length of the first mandrel line segments.

In furtherance of one or more of the second embodiments, forming the pair of mandrels further comprises patterning a mask material into a first mandrel comprising a nominal mandrel segment of nominal lateral width abutted to a wider mandrel segment having a wider lateral width than the nominal lateral width by an amount substantially equal to the difference in lateral width of the nominal space and narrower space.

In furtherance of the embodiment immediately above, forming the pair of mandrels further comprises patterning a mask material into a first mandrel comprising a nominal mandrel segment of nominal lateral width abutted to a wider mandrel segment having a wider lateral width than the nominal lateral width by an amount substantially equal to the lateral width of the spacer.

In furtherance of one or more of the second embodiments, interconnecting the fuse line with a first electrical connection to the nominal fuse segment further comprises forming a via that intersects the nominal fuse segment, the via having a lateral via width that is larger than the narrower space; and filling the via with a metal.

In furtherance of one or more of the second embodiments, forming the spacer further comprises depositing a dielectric material to a first thickness with a conformal deposition process, and etching through the first thickness of dielectric material with an anisotropic etching process.

In furtherance of one or more of the second embodiments, patterning the pair of adjacent mandrel lines in a first material further comprises printing an array of mandrel lines into a first photoresist, the mandrel lines within the array having the nominal space, and printing a blocking pattern into a second photoresist applied over the first photoresist to form a field portion within the mandrel line array adjacent to at least one of the pair of mandrel lines along a length at least equal to the second spacer segments.

In furtherance of one or more of the second embodiments, the pair of adjacent mandrel lines is anisotropically patterned into a first dielectric material, forming the spacer further comprises conformally depositing a second dielectric material having a composition distinct from the first dielectric material, and forming the interconnect fuse line further comprises plating a metal into a space adjacent the spacer and polishing the metal to be planar with the spacer.

In one or more third embodiment, an electronic device, includes a processor including first integrated circuitry and a memory communicatively coupled to the processor, the memory including second integrated circuitry. At least one of the first and second integrated circuitry include any of the interconnect fuse structures described for any one of first embodiments.

In furtherance of the one or more third embodiment, a first of the interconnect lines comprises a wider line segment abutted between two nominal line end segments having the nominal lateral width. The wider line segment has a wider lateral width that is larger than the nominal lateral width. The wider line segment has a lateral length that is less than that of the necked fuse segment. The wider line segment is aligned along the length dimension to a center of the necked fuse segment. The amount by which the wider lateral width is larger than the nominal lateral width is at least equal to a spacing between the nominal fuse segment and the two nominal line end segments.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An integrated circuit (IC) fuse structure, comprising:
    an interconnect fuse line disposed over a substrate, the fuse line comprising a nominal fuse segment abutted to a necked fuse segment, wherein the nominal fuse segment has a nominal lateral width, and the necked fuse segment has a necked lateral width that is smaller than the nominal lateral width;
    a pair of interconnect lines disposed over the substrate and coplanar with the fuse line, and each of the interconnect lines spaced equidistant from opposite edges of both the nominal fuse segment and the necked fuse segment; and
    a pair of electrical connections to the fuse line, the pair of connections comprising a first connection to the nominal fuse segment, and a second connection spaced apart from the first connection by at least the necked fuse segment.

2. The IC fuse structure of claim 1, wherein:
    a first of the interconnect lines comprises a wider line segment abutted between two nominal line end segments having the nominal lateral width;
    the wider line segment has a wider lateral width that is larger than the nominal lateral width;
    the wider line segment has a lateral length that is less than that of the necked fuse segment; and
    the wider line segment is aligned along the length dimension to a center of the necked fuse segment.

3. The IC fuse structure of claim 2, wherein:
    the necked lateral width is narrower than the nominal lateral width by an amount substantially equal to the amount by which the wider lateral width is larger than the nominal lateral width; or
    the first and second interconnect lines each comprise a wider line segment having a lateral width that is larger than the nominal lateral width by amounts that combine to substantially equal to the difference between the necked lateral width and the nominal lateral width.

4. The IC fuse structure of claim 2, the necked lateral width is narrower than the nominal lateral width by an amount substantially equal to the amount by which the wider lateral width is larger than the nominal lateral width.

5. The IC fuse structure of claim 2, wherein:
    the amount by which the wider lateral width is larger than the nominal lateral width is at least equal to a spacing between the nominal fuse segment and the two nominal line end segments.

6. The IC fuse structure of claim 1, wherein:
    the fuse line comprises the nominal fuse segment abutted to the necked fuse segment on a first end, and a second nominal fuse segment abutted to the necked fuse segment on a second end; and
    the pair of electrical connections intersect the nominal fuse segments.

7. The IC fuse structure of claim 6, wherein:
    the pair of electrical connections include a pair of conductive vias extending in a third dimension, a first via having a via width that is greater than the necked fuse segment width.

8. The IC fuse structure of claim 1, wherein a second of the interconnect lines is of the nominal lateral width along a line length that is adjacent to both the nominal and necked fuse segments.

9. A method of fabricating an integrated circuit (IC) fuse structure, the method comprising:
    forming over a substrate two mandrel lines having outside edges that are laterally spaced apart by at least a first distance, and having inside edges that are laterally spaced apart by a nominal space along a first segment and by a narrower space along a second segment;
    converting the two mandrel lines, with a pitch-reducing spacer-based patterning process, into three adjacent interconnect lines disposed within the first distance and spaced apart from each other by two equal distances, wherein the three lines include a center interconnect line that further comprises a nominal line segment of a nominal lateral width and a necked line segment of a narrower width; and
    interconnecting the center interconnect line with electrical connections that are spaced apart by at least the necked line segment.

10. The method of claim 9, wherein:
    forming the mandrel lines further comprises:
        patterning a pair of adjacent mandrel lines in a first material disposed over a substrate to have first mandrel line segments laterally spaced apart by a narrower space and second mandrel line segments laterally spaced apart by a nominal space that is larger than the narrower space;
    converting the two mandrel lines, with a pitch-reducing spacer-based patterning process, into three adjacent interconnect lines further comprises:
        forming a spacer along edges of the mandrel lines, the spacer including first spacer segments disposed within the nominal space and second spacer segments disposed within the narrower space, with the spacer segments having a lateral width that is less than one half the narrower space;
        removing the pair of mandrel lines selectively from the pair of spacers; and
        forming an interconnect fuse line between the spacers, the fuse line having a nominal fuse segment filling a space between the first spacer segments and abutted to a necked fuse segment filling a space between the second spacer segments.

11. The method of claim 10, further comprising forming a pair of interconnect lines concurrently with forming the fuse line by backfilling with a metal the regions from which the pair of mandrel lines were removed.

12. The method of claim 11, wherein:
forming the fuse line further comprises backfilling the nominal and narrower spaces between the spacer with the metal; and
the narrower space is formed to a lateral length that is larger than a lateral length of the first mandrel line segments.

13. The method of claim 10, wherein forming the pair of mandrels further comprises:
patterning a mask material into a first mandrel comprising a nominal mandrel segment of nominal lateral width abutted to a wider mandrel segment having a wider lateral width than the nominal lateral width by an amount substantially equal to the difference in lateral width of the nominal space and narrower space.

14. The method of claim 13, wherein forming the pair of mandrels further comprises:
patterning a mask material into a first mandrel comprising a nominal mandrel segment of nominal lateral width abutted to a wider mandrel segment having a wider lateral width than the nominal lateral width by an amount substantially equal to the lateral width of the spacer.

15. The method of claim 10, wherein interconnecting the fuse line with a first electrical connection to the nominal fuse segment further comprises:
forming a via that intersects the nominal fuse segment, the via having a lateral via width that is larger than the narrower space; and
filling the via with a metal.

16. The method of claim 10, wherein:
forming the spacer further comprises:
depositing a dielectric material to a first thickness with a conformal deposition process; and
etching through the first thickness of dielectric material with an anisotropic etching process.

17. The method of claim 10, wherein patterning the pair of adjacent mandrel lines in a first material further comprises:
printing an array of mandrel lines into a first photoresist, the mandrel lines within the array having the nominal space; and
printing a blocking pattern into a second photoresist applied over the first photoresist to form a field portion within the mandrel line array adjacent to at least one of the pair of mandrel lines along a length at least equal to the second spacer segments.

18. The method of claim 10, wherein:
the pair of adjacent mandrel lines is anisotropically patterned into a first dielectric material;
forming the spacer further comprises conformally depositing a second dielectric material having a composition distinct from the first dielectric material; and
forming the interconnect fuse line further comprises plating a metal into a space adjacent the spacer and polishing the metal to be planar with the spacer.

19. An electronic device, comprising:
a processor including first integrated circuitry;
a memory communicatively coupled to the processor, the memory including second integrated circuitry, wherein at least one of the first and second integrated circuitry include an interconnect fuse further comprising:
an interconnect fuse line disposed over a substrate, the fuse line comprising a nominal fuse segment abutted to a necked fuse segment, wherein the nominal fuse segment has a nominal lateral width, and the necked fuse segment has a necked lateral width that is smaller than the nominal lateral width;
a pair of interconnect lines disposed over the substrate and coplanar with the fuse line, and each of the interconnect lines spaced equidistant from opposite edges of both the nominal fuse segment and the necked line segment; and
a pair of electrical connections to the fuse line, the pair of connections comprising a first connection to the nominal fuse segment, and a second connection spaced apart from the first connection by at least the necked fuse segment.

20. The electronic device of claim 19, wherein
a first of the interconnect lines comprises a wider line segment abutted between two nominal line end segments having the nominal lateral width;
the wider line segment has a wider lateral width that is larger than the nominal lateral width;
the wider line segment has a lateral length that is less than that of the necked fuse segment;
the wider line segment is aligned along the length dimension to a center of the necked fuse segment; and
the amount by which the wider lateral width is larger than the nominal lateral width is at least equal to a spacing between the nominal fuse segment and the two nominal line end segments.

* * * * *